United States Patent
Yeon et al.

(10) Patent No.: US 11,244,894 B2
(45) Date of Patent: Feb. 8, 2022

(54) SEMICONDUCTOR PACKAGES

(71) Applicant: Samsung Electronics Co., Ltd., Suwon-si (KR)

(72) Inventors: Seunghoon Yeon, Suwon-si (KR); Wonil Lee, Hwaseong-si (KR); Yonghoe Cho, Bucheon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/809,116

(22) Filed: Mar. 4, 2020

(65) Prior Publication Data

US 2021/0028102 A1    Jan. 28, 2021

(30) Foreign Application Priority Data

Jul. 22, 2019 (KR) .......... 10-2019-0088526

(51) Int. Cl.

| | |
|---|---|
| H01L 29/00 | (2006.01) |
| H01L 23/522 | (2006.01) |
| H01L 23/498 | (2006.01) |
| H01L 23/48 | (2006.01) |
| H01L 23/00 | (2006.01) |

(52) U.S. Cl.
CPC ........ *H01L 23/5223* (2013.01); *H01L 23/481* (2013.01); *H01L 23/49827* (2013.01); *H01L 23/49838* (2013.01); *H01L 23/5227* (2013.01); *H01L 24/05* (2013.01); *H01L 24/16* (2013.01); H01L 23/49894 (2013.01); H01L 2224/02331 (2013.01); H01L 2224/02372 (2013.01); H01L 2224/02381 (2013.01); H01L 2224/05569 (2013.01); H01L 2224/16145 (2013.01)

(58) Field of Classification Search
None
See application file for complete search history.

(56) References Cited

U.S. PATENT DOCUMENTS

| | | |
|---|---|---|
| 8,258,599 B2 | 9/2012 | Lam |
| 8,362,599 B2 | 1/2013 | Kim et al. |
| 8,945,985 B2 * | 2/2015 | Kim ........................ H01L 24/81 438/107 |
| 8,970,516 B2 | 3/2015 | Black et al. |
| 9,035,457 B2 | 5/2015 | Lin et al. |
| 9,209,131 B2 | 12/2015 | Gu et al. |
| 10,217,716 B2 | 2/2019 | Yu et al. |

(Continued)

*Primary Examiner* — Hung K Vu
(74) *Attorney, Agent, or Firm* — Myers Bigel, P.A.

(57) ABSTRACT

A semiconductor package includes a semiconductor device having a through silicon via, a lower redistribution structure on the semiconductor device, the lower redistribution structure including a lower redistribution insulating layer and a lower redistribution pattern electrically connected to the through silicon via, a package connection terminal on the lower redistribution structure and electrically connected to the lower redistribution pattern, an upper redistribution structure on the semiconductor device and including an upper redistribution insulating layer and an upper redistribution pattern electrically connected to the through silicon via, a conductive via in contact with the upper redistribution pattern and on the upper redistribution insulating layer, a connection pad on the conductive via, and a passive element pattern on the upper redistribution structure and electrically connected to the conductive via.

20 Claims, 16 Drawing Sheets

(56) References Cited

U.S. PATENT DOCUMENTS

| | | | |
|---|---|---|---|
| 2007/0138572 A1* | 6/2007 | Lam | H01L 24/32 |
| | | | 257/379 |
| 2017/0309587 A1 | 10/2017 | Nakashiba | |
| 2018/0082966 A1 | 3/2018 | Chen et al. | |
| 2019/0013301 A1 | 1/2019 | Cheah et al. | |
| 2019/0067244 A1* | 2/2019 | Chen | H01L 23/3142 |
| 2020/0411474 A1* | 12/2020 | Jeng | H01L 24/97 |

* cited by examiner

SEMICONDUCTOR PACKAGES

CROSS-REFERENCE TO RELATED APPLICATION

This application claims the benefit of Korean Patent Application No. 10-2019-0088526, filed on Jul. 22, 2019, in the Korean Intellectual Property Office, the disclosure of which is incorporated herein in its entirety by reference.

BACKGROUND

The inventive concepts relate to semiconductor packages, and more particularly, to semiconductor packages including a plurality of semiconductor devices.

There has been an increasing demand for semiconductor devices having high memory capacities and thin, lightweight semiconductor packages including such semiconductor devices. In addition, research has been conducted into semiconductor packages including semiconductor devices having various functions and techniques for rapidly driving the semiconductor devices. In response to this trend, research into semiconductor packages in which second semiconductor devices are mounted on first semiconductor devices has actively progressed.

SUMMARY

The inventive concepts provide semiconductor packages including a passive element. The inventive concepts also provide semiconductor packages that are thin and lightweight.

According to an aspect of the inventive concepts, there is provided a semiconductor package including a package substrate, an external connection terminal electrically connected to the package substrate, a first semiconductor device on the package substrate, the first semiconductor device having a through silicon via, a lower redistribution structure between the first semiconductor device and the package substrate, the lower redistribution structure including a lower redistribution insulating layer and a lower redistribution pattern electrically connected to the through silicon via, a package connection terminal between the lower redistribution structure and the package substrate, the package connection terminal being configured to electrically connect the lower redistribution pattern to the package substrate, an upper redistribution structure on the first semiconductor device, the upper redistribution structure including an upper redistribution insulating layer and an upper redistribution pattern electrically connected to the through silicon via, a conductive via in contact with the upper redistribution pattern, the conductive via being on the upper redistribution insulating layer, a connection pad on the conductive via, a passive element pattern on the upper redistribution structure, a chip connection terminal on the connection pad, an adhesive layer on the chip connection terminal on the upper redistribution structure, and a chip pad electrically connected to the chip connection terminal. The connection pad is between the conductive via and the chip connection terminal, and the passive element pattern is between the upper redistribution insulating layer and the adhesive layer and is electrically connected to the conductive via.

According to another aspect of the inventive concepts, there is provided a semiconductor package including a first semiconductor device having a through silicon via, a lower redistribution structure on the first semiconductor device, the lower redistribution structure including a lower redistribution insulating layer and a lower redistribution pattern electrically connected to the through silicon via, a package connection terminal on the lower redistribution structure, the package connection terminal being electrically connected to the lower redistribution pattern, an upper redistribution structure on the first semiconductor device, the upper redistribution structure including an upper redistribution insulating layer and an upper redistribution pattern electrically connected to the through silicon via, a conductive via in contact with the upper redistribution pattern, the conductive via being on the upper redistribution insulating layer, a connection pad on the conductive via, a passive element pattern on the upper redistribution structure, a chip connection terminal on the connection pad, an adhesive layer on the chip connection terminal, and a chip pad electrically connected to the chip connection terminal. The connection pad is between the conductive via and the chip connection terminal, and the passive element pattern is between the upper redistribution insulating layer and the adhesive layer, and the passive element pattern is electrically connected to the conductive via.

According to another aspect of the inventive concepts, there is provided a semiconductor package including a semiconductor device having a through silicon via, a lower redistribution structure on the semiconductor device, the lower redistribution structure including a lower redistribution insulating layer and a lower redistribution pattern electrically connected to the through silicon via, a package connection terminal on the lower redistribution structure, the package connection terminal being electrically connected to the lower redistribution pattern, an upper redistribution structure on the semiconductor device, the upper redistribution structure including an upper redistribution insulating layer and an upper redistribution pattern electrically connected to the through silicon via, a conductive via in contact with the upper redistribution pattern, the conductive via being on the upper redistribution insulating layer, a connection pad on the conductive via, and a passive element pattern on the upper redistribution structure, the passive element pattern electrically connected to the conductive via.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Hereinafter, embodiments of the inventive concepts will be described in detail with reference to the accompanying drawings.

Figure 1:
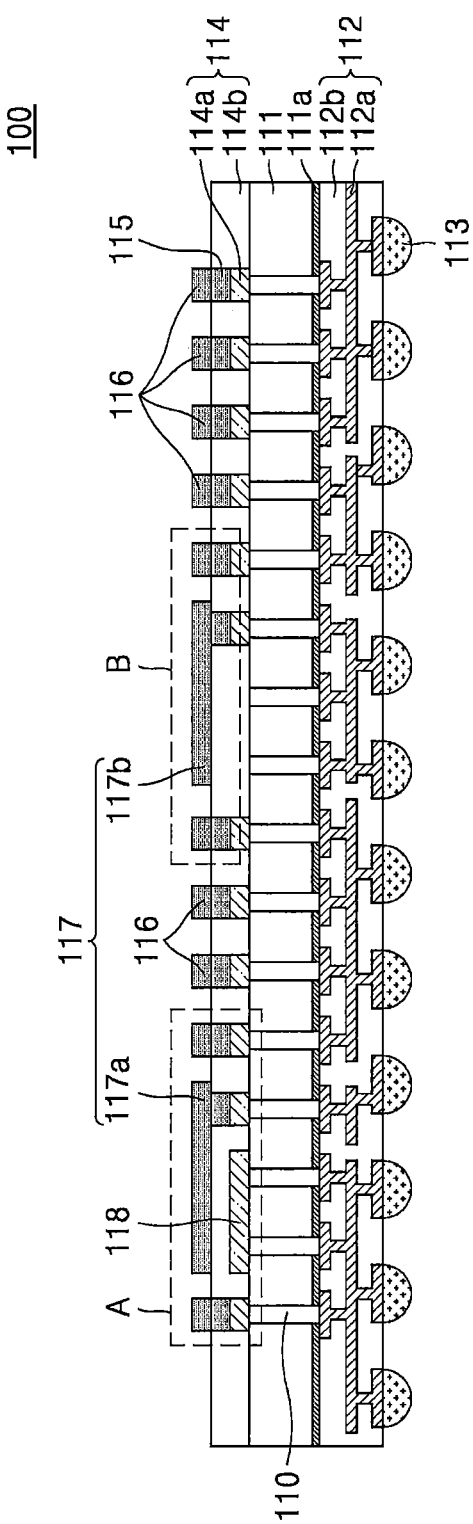
FIG. 1 is a cross-sectional view of a semiconductor package according to an embodiment of the inventive concepts.

FIG. 1 is a cross-sectional view of a semiconductor package 100 according to an embodiment of the inventive concepts.

Referring to FIG. 1, the semiconductor package 100 may include a first semiconductor device 111 including a through silicon via (TSV) 110, a lower redistribution structure 112, package connection terminals 113, an upper redistribution structure 114, conductive vias 115, connection pads 116, and a passive element pattern 117.

In an embodiment, the first semiconductor device 111 may be on the lower redistribution structure 112 and electrically connected to a lower redistribution pattern 112a of the lower redistribution structure 112. The first semiconductor device 111 may be a logic semiconductor device, such as a central processing unit (CPU) and/or an application processor (AP), or a memory semiconductor device, such as dynamic random access memory (DRAM) and/or magnetic RAM (MRAM). As used herein, the term "and/or" includes any and all combinations of one or more of the associated listed items.

In an embodiment, the first semiconductor device 111 may include a first semiconductor element layer 111a, which may be formed in and/or on a lower portion of the first semiconductor device 111. The first semiconductor element layer 111a may include various kinds of individual elements. The plurality of individual elements may include various microelectronic devices such as, for example, a metal-oxide-semiconductor field effect transistor (MOSFET) (e.g., a complementary-metal-oxide-semiconductor (CMOS) transistor)), a system large-scale integration (LSI) device, an image sensor (e.g., CMOS imaging sensor (CIS)), and/or a micro-electro-mechanical system (MEMS).

In an embodiment, the first semiconductor device 111 may include the through silicon via 110. The through silicon via 110 may be formed to pass through a top surface and a bottom surface of the first semiconductor device 111. The through silicon via 110 may have a pillar shape and may include a barrier film (not shown) formed on a surface of the pillar shape and a buried conductive layer (not shown) within and, in some embodiments, filling the inside of the barrier film.

Furthermore, the through silicon via 110 may extend into the first semiconductor element layer 111a, and the buried conductive layer of the through silicon via 110 may be electrically connected to the first semiconductor element layer 111a.

In an embodiment, the lower redistribution structure 112 may be located under the first semiconductor device 111 (e.g., between the first semiconductor device 111 and the package connection terminals 113) and support the first semiconductor device 111. The lower redistribution structure 112 may include a lower redistribution pattern 112a and a lower redistribution insulating layer 112b.

The lower redistribution pattern 112a may be electrically connected to the first semiconductor device 111. More specifically, the lower redistribution pattern 112a may be electrically connected to the through silicon via of the first semiconductor device 111. The lower redistribution pattern 112a may provide an electrical connection path for electrically connecting the first semiconductor device 111 to the package connection terminals 113.

The lower redistribution insulating layer 112b may surround the lower redistribution pattern 112a. The lower redistribution insulating layer 112b may protect the lower redistribution pattern 112a from external impact and prevent the occurrence of an electrical short in the lower redistribution pattern 112a. For example, the lower redistribution insulating layer 112b may include at least one of an epoxy resin, polybenzobisoxazole (PBO), benzocyclobutene (BCB), polyimide, and/or a polyimide derivative.

In an embodiment, the package connection terminals 113 may be terminals configured to connect the semiconductor package 100 to an external device. The package connection terminals 113 may be electrically connected to the lower redistribution pattern 112a.

In an embodiment, the upper redistribution structure 114 may be located on the first semiconductor device 111 (e.g., between the first semiconductor device 111 and the connection pads 116). The upper redistribution structure 114 may include an upper redistribution pattern 114a and an upper redistribution insulating layer 114b.

The upper redistribution pattern 114a may be electrically connected to the first semiconductor device 111. More specifically, the upper redistribution pattern 114a may be electrically connected to the through silicon via 110 of the first semiconductor device 111. The upper redistribution pattern 114a may provide an electrical connection path for electrically connecting a second semiconductor device (refer to 211 in FIGS. 5 and/or 6) mounted on the upper redistribution structure 114 to the through silicon via 110.

The upper redistribution insulating layer 114b may surround the upper redistribution pattern 114a. The upper redistribution insulating layer 114b may protect the upper redistribution pattern 114a from external impact and prevent the occurrence of an electrical short in the upper redistribution pattern 114a. For instance, the upper redistribution insulating layer 114b may include at least one of an epoxy resin, PBO, BCB, polyimide, and/or a polyimide derivative.

In an embodiment, the upper redistribution pattern 114a may have a smaller thickness than the upper redistribution insulating layer 114b. In other words, a top surface of the upper redistribution pattern 114a may be at a lower level than a top surface of the upper redistribution insulating layer 114b.

In an embodiment, the conductive vias 115 may be located on the upper redistribution pattern 114a. More specifically, bottom surfaces of the conductive vias 115 may be in contact with the top surface of the upper redistribution pattern 114a, and side surfaces of the conductive vias 115 may be in contact with the upper redistribution insulating layer 114b. The upper redistribution insulating layer 114b may surround the side surfaces of the conductive vias 115. The conductive vias 115 may include a conductive material. For example, the conductive vias 115 may include at least one metal of copper (Cu), aluminum (Al), nickel (Ni), tungsten (W), platinum (Pt), and/or gold (Au).

In an embodiment, the connection pads 116 may be located on the conductive vias 115. More specifically, bottom surfaces of the connection pads 116 may be in contact with top surfaces of the conductive vias 115. Also, top surfaces of the connection pads 116 may be at a higher level than the top surface of the upper redistribution insulating layer 114b, and the top surfaces and side surfaces of the connection pads 116 may be exposed to the outside.

The connection pads 116 may electrically connect the second semiconductor device (refer to 211 in FIGS. 5 and/or 6) mounted on the semiconductor package 100 to the first semiconductor device 111. More specifically, chip connection terminals 213 may be located on the connection pads 116 and electrically connected to chip pads 212 of the second semiconductor device 211. The second semiconductor device 211 may sequentially pass through the chip pads 212, the chip connection terminals 213, the connection pads 116, the conductive vias 115, the upper redistribution pattern 114a, and the through silicon via 110 and be electrically connected to the first semiconductor device 111.

In an embodiment, the passive element pattern 117 may be located on the upper redistribution structure 114. More specifically, the passive element pattern 117 may be located on the upper redistribution insulating layer 114b. Also, the passive element pattern 117 may be electrically connected to ones of the conductive vias 115. More specifically, a region of a bottom surface of the passive element pattern 117 may be in contact with the top surfaces of the ones of the conductive vias 115, and the passive element pattern 117 may be electrically connected to the ones of the conductive vias 115.

In an embodiment, the passive element pattern 117 may form a passive element on the upper redistribution structure 114, and the passive element may be used for an operation of the first semiconductor device 111 and/or an operation of the second semiconductor device (refer to 211 in FIGS. 5 and/or 6) mounted on the first semiconductor device 111. For example, the passive element pattern 117 may form at least one passive element of a capacitor, an inductor, and a resistor, which is used for the operation of the first semiconductor device 111 and/or the operation of the second semiconductor device 211.

In an embodiment, the passive element pattern 117 may include a first plate-type conductive pattern 117a. The first plate-type conductive pattern 117a may implement a passive element including functions of a capacitor and/or a resistor together with a second plate-type conductive pattern 118 to be described below.

In addition, the passive element pattern 117 may include a spiral conductive pattern 117b. The spiral conductive pattern 117b may implement a passive element including functions of an inductor and/or a resistor. The passive element pattern 117 according to the present embodiment will be described in further detail with reference to FIGS. 2 to 5.

In an embodiment, the passive element pattern 117 may include substantially the same material as the connection pads 116. More specifically, the passive element pattern 117 and the connection pads 116 may include a conductive metal, for example, at least one metal of copper (Cu), aluminum (Al), nickel (Ni), tungsten (W), platinum (Pt), and/or gold (Au).

For example, the passive element pattern 117 and the connection pads 116 may have a thickness of about 2 µm to about 5 µm. Also, a top surface of the passive element pattern 117 may be at substantially the same level as the top surfaces of the connection pads 116.

Since the semiconductor package 100 according to the present embodiment may include the passive element pattern 117 on the first semiconductor device 111, it may be unnecessary to form an additional passive element on the package substrate (refer to 170 in FIG. 7) on which the semiconductor package 100 is mounted.

Furthermore, the passive element pattern 117 and the connection pads 116 of the semiconductor package 100 according to the present embodiment may have substantially the same thickness of about 2 µm to about 5 µm. Thus, the semiconductor package 100 may be thin and lightweight.

Figure 2:
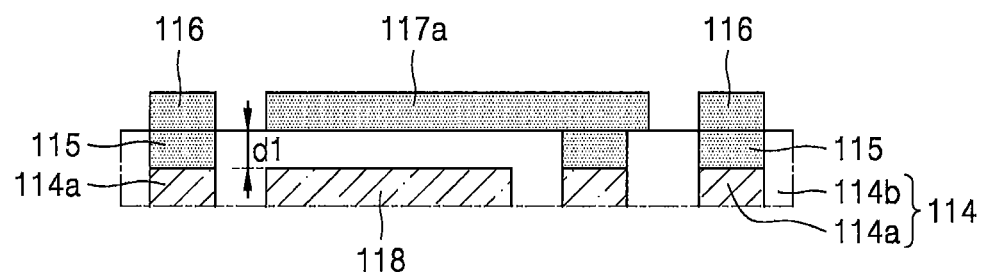
FIG. 2 is an enlarged view of portion A of the semiconductor package of FIG. 1.
Figure 3:
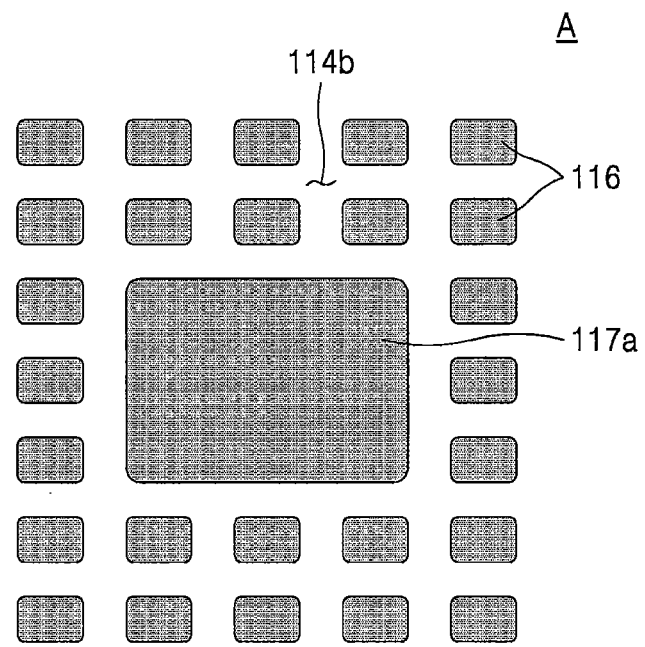
FIG. 3 is a plan view of portion A of the semiconductor package of FIG. 1.

FIG. 2 is an enlarged view of portion A of the semiconductor package 100 of FIG. 1, and FIG. 3 is a plan view of portion A of the semiconductor package 100 of FIG. 1.

Referring to FIGS. 1 to 3, the passive element pattern 117 of the semiconductor package 100 may include the first plate-type conductive pattern 117a. Also, the semiconductor package 100 may include the second plate-type conductive pattern 118.

In an embodiment, the first plate-type conductive pattern 117a may have a plate form. The first plate-type conductive pattern 117a may have a polygonal plate form. For example, as shown in FIG. 3, the first plate-type conductive pattern 117a may have a tetragonal plate form. However, the inventive concepts are not limited thereto, and the first plate-type conductive pattern 117a may have a polygonal plate form including, for example, a pentagonal shape, a hexagonal shape, or an octagonal shape.

In an embodiment, the semiconductor package 100 according to the present embodiment may further include the second plate-type conductive pattern 118. The second plate-type conductive pattern 118 may have a plate form. More specifically, the second plate-type conductive pattern 118 may have a polygonal plate form. For example, the second plate-type conductive pattern 118 may be formed in a shape corresponding to a shape of the first plate-type conductive pattern 117a. For example, when the first plate-type conductive pattern 117a has a tetragonal plate form, the second plate-type conductive pattern 118 may also have a tetragonal plate form.

A bottom surface of the second plate-type conductive pattern 118 may be in contact with the through silicon via 110, and the second plate-type conductive pattern 118 may be electrically connected to the through silicon via 110 (e.g., to one or more of a plurality of through silicon vias 110). Also, a side surface and a top surface of the second plate-type conductive pattern 118 may be on, and in some embodiments, surrounded by the upper redistribution insulating layer 114b.

The second plate-type conductive pattern 118 may include the same material as the upper redistribution pattern 114a. For example, the second plate-type conductive pattern 118 and the upper redistribution pattern 114a may include at least one metal of copper (Cu), aluminum (Al), nickel (Ni), tungsten (W), platinum (Pt), and gold (Au).

The second plate-type conductive pattern 118 may have substantially the same thickness (e.g., in a vertical direction) as the upper redistribution pattern 114a. For example, the top surface of the second plate-type conductive pattern 118 may be at substantially the same level as the top surface of the upper redistribution pattern 114a.

In an embodiment, a bottom surface of the first plate-type conductive pattern 117a may have a larger area than the top surface of the second plate-type conductive pattern 118. Also, the second plate-type conductive pattern 118 may overlap the first plate-type conductive pattern 117a in a vertical direction. For example, when the first plate-type conductive pattern 117a and the second plate-type conductive pattern 118 are viewed from above, an area occupied by the second plate-type conductive pattern 118 may be included, and in some embodiments completely included, in an area occupied by the first plate-type conductive pattern 117a.

In an embodiment, portions of the upper redistribution insulating layer 114b may be interposed between the first plate-type conductive pattern 117a and the second plate-type conductive pattern 118. More specifically, portions of the upper redistribution insulating layer 114b may have a thickness d1 (e.g., about 2 µm to about 5 µm) between the first plate-type conductive pattern 117a and the second plate-type conductive pattern 118.

In an embodiment, the first plate-type conductive pattern 117a of the semiconductor package 100 may implement a passive element including functions of a capacitor and/or a resistor together with the second plate-type conductive pattern 118 and the upper redistribution insulating layer 114b. The passive element may be used for an operation of the first semiconductor device 111 and/or an operation of the second semiconductor device (refer to 211 in FIGS. 5 and/or 6) mounted on the first semiconductor device 111.

Figure 4:
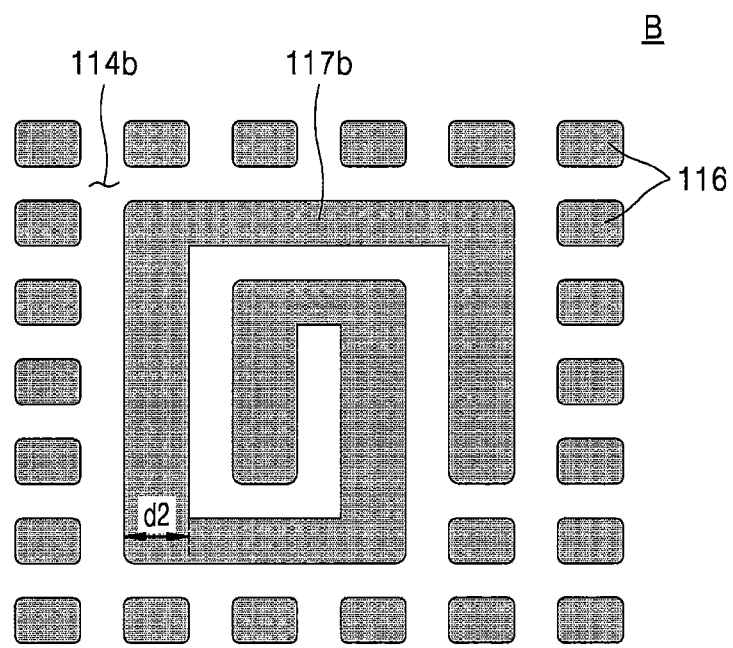
FIG. 4 is a plan view of portion B of the semiconductor package of FIG. 1.

FIG. 4 is a plan view of portion B of the semiconductor package 100 of FIG. 1.

Referring to FIGS. 1 and 4, the passive element pattern 117 of the semiconductor package 100 may include the spiral conductive pattern 117b. The spiral conductive pattern 117b may be located on the upper redistribution insulating layer 114b. A first region of a bottom surface of the spiral conductive pattern 117b may be in contact with the top surfaces of ones of the conductive vias 115, and a second region thereof may be in contact with portions of the upper redistribution insulating layer 114b. It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

In an embodiment, the spiral conductive pattern 117b may have a spiral shape. For example, the spiral conductive pattern 117b may be spiraled into a polygonal shape. For example, as shown in FIG. 4, the spiral conductive pattern 117b may be spiraled into a tetragonal shape. However, the inventive concepts are not limited thereto, and the spiral conductive pattern 117b may be spiraled into polygonal shapes, such as a pentagonal shape, a hexagonal shape, or an octagonal shape. In addition, the spiral conductive pattern 117b may be spiraled into a circular shape.

In an embodiment, when the spiral conductive pattern 117b is viewed from above, the spiral conductive pattern 117b may have a width d2 (e.g., in a horizontal direction) of about 2 μm to about 15 μm. Also, the spiral conductive pattern 117b may have a thickness (e.g., in the vertical direction) of about 2 μm to about 5 μm.

In an embodiment, the spiral conductive pattern 117b of the semiconductor package 100 may implement a passive element including functions of an inductor and/or a resistor. The passive element may be used for an operation of the first semiconductor device 111 and/or an operation of the second semiconductor device 211 mounted on the first semiconductor device 111.

Figure 5:
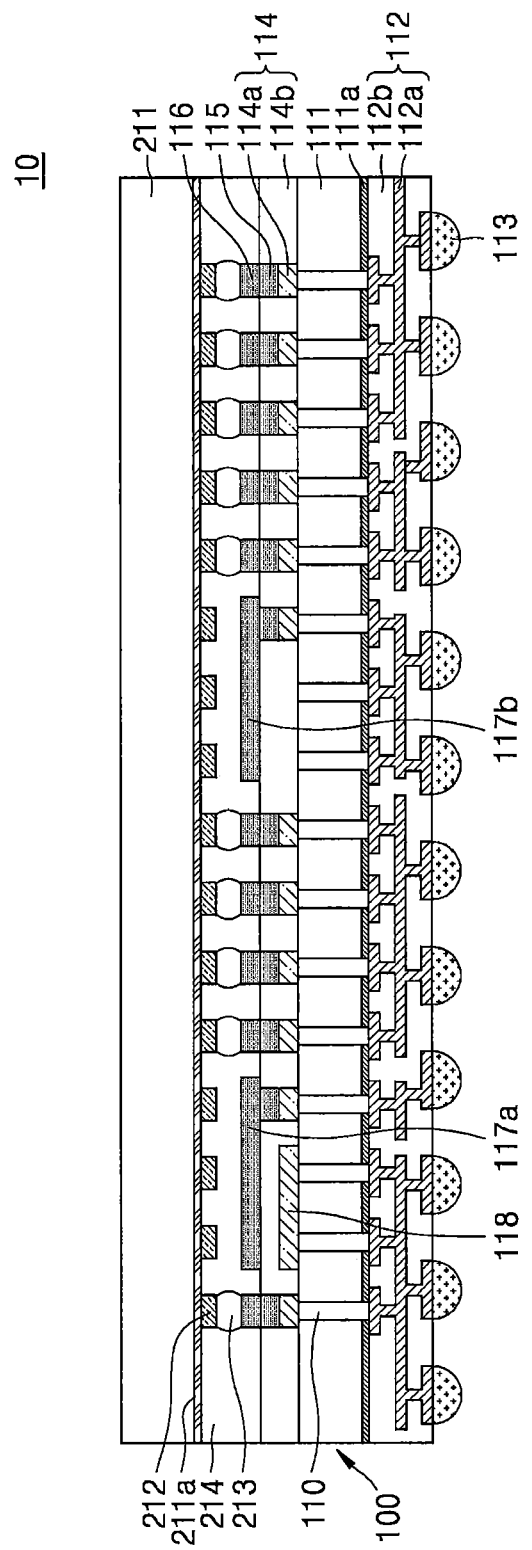
FIGS. 5 to 10 are cross-sectional views of semiconductor packages according to an embodiment of the inventive concepts.

FIG. 5 is a cross-sectional view of a semiconductor package 10 according to an embodiment of the inventive concepts. More specifically, the semiconductor package 10 of FIG. 5 may be a semiconductor package in which a second semiconductor device 211 is mounted on the semiconductor package 100 described with reference to FIG. 1.

Referring to FIG. 5, the semiconductor package 10 may further include a second semiconductor device 211, chip connection terminals 213, and an adhesive layer 214.

In an embodiment, the second semiconductor device 211 may include a second semiconductor element layer 211a and chip pads 212. The second semiconductor element layer 211a may be formed under the second semiconductor device 211 (e.g., between the second semiconductor device 211 and the first semiconductor device 111). The second semiconductor element layer 211a may include various kinds of individual elements. The second semiconductor element layer 211a according to the present embodiment may be understood with reference to the first semiconductor element layer 111a of FIG. 1 and thus, a detailed description thereof will be omitted.

In an embodiment, the second semiconductor device 211 may be a semiconductor device different from the first semiconductor device 111. For example, the second semiconductor device 211 may be a memory semiconductor device, and the first semiconductor device 111 may be a logic semiconductor device, though the inventive concepts are not limited thereto.

In an embodiment, the chip pads 212 may be formed under the second semiconductor element layer 211a (e.g., between the second semiconductor element layer 211a and the first semiconductor device 111) and may be electrically connected to a plurality of individual elements of the second semiconductor element layer 211a.

In an embodiment, the chip connection terminals 213 may be respectively located on connection pads 116. More specifically, the chip connection terminals 213 may be interposed between the chip pads 212 and the connection pads 116 and electrically connect the chip pads 212 to the connection pads 116. The second semiconductor device 211 may be electrically connected to the chip pads 212, the chip connection terminals 213, the connection pads 116, the conductive vias 115, the upper redistribution pattern 114a, and the through silicon via 110 and be electrically connected to the first semiconductor device 111.

In an embodiment, the adhesive layer 214 may be between an upper redistribution structure 114 and the second semiconductor device 211. The adhesive layer 214 may be on, and in some embodiments, surround the chip pads 212, the chip connection terminals 213, the connection pads 116, and/or a passive element pattern 117 (e.g., patterns 117a and/or 117b) on the upper redistribution structure 114. The adhesive layer 214 may be a non-conductive film (NCF), for example, a film including an insulating polymer. The adhesive layer 214 may adhere the second semiconductor device 211 onto the upper redistribution structure 114.

The semiconductor package 10 according to the present embodiment may include the passive element pattern 117 (e.g., patterns 117a and/or 117b) located on an upper redistribution insulating layer 114b. Thus, the semiconductor package 10 may be thin and lightweight.

Figure 6:
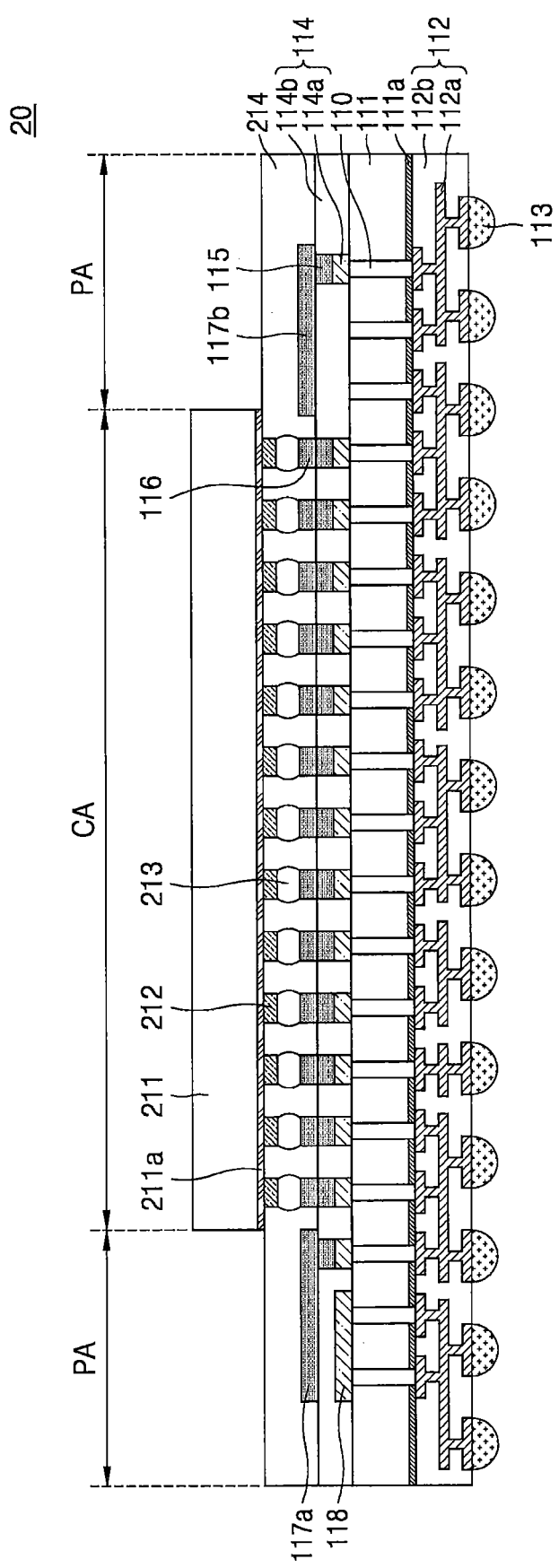

FIG. 6 is a cross-sectional view of a semiconductor package 20 according to an embodiment of the inventive concepts. More specifically, the semiconductor package 20 of FIG. 6 may be a semiconductor package in which a second semiconductor device 211 is mounted on the semiconductor package 100 described with reference to FIG. 1. The semiconductor package 20 of FIG. 6 may be understood with reference to the semiconductor package 10 described with reference to FIG. 5 and thus, a detailed description thereof will be omitted.

Referring to FIG. 6, a first semiconductor device 111 may have a width greater than a width of the second semiconductor device 211. In other words, a top surface of the first semiconductor device 111 may have an area larger than an area of a top surface of the second semiconductor device 211.

In an embodiment, the semiconductor package 20 may include a connection area CA and a passive element area PA. The connection area CA may be a region in which the first semiconductor device 111 is electrically connected to the second semiconductor device 211 in the semiconductor package 20. Also, the passive element area PA may be a region in which passive elements used for an operation of the first semiconductor device 111 and/or an operation of the second semiconductor device 211 are formed.

As shown in FIG. 6, the connection area CA may be formed in a region in which the first semiconductor device 111 overlaps the second semiconductor device 211 in the vertical direction. In the connection area CA of the semiconductor package 20, an adhesive layer 214 may not be exposed to the outside by the second semiconductor device 211. For example, in the connection area CA of the semiconductor package 20, the adhesive layer 214 may be between the second semiconductor device 211 and the first semiconductor device 111. Also, the passive element area PA may be formed in a region in which the first semiconductor device 111 does not overlap the second semiconductor device 211 in the vertical direction. In the passive element area PA of the semiconductor package 20, the adhesive layer 214 may be exposed to the outside.

In an embodiment, the semiconductor package 20 may include chip connection terminals 213 and connection pads 116 in the connection area CA and thus, the first semiconductor device 111 may be electrically connected to the second semiconductor device 211. As shown in FIG. 6, the semiconductor package 20 may not include the passive element pattern 117 (e.g., patterns 117a and/or 117b) in the connection area CA.

In an embodiment, the semiconductor package 20 may include the passive element pattern 117 (e.g., patterns 117a and/or 117b) in the passive element area PA and form passive elements used for an operation of the first semiconductor device 111 and/or an operation of the second semiconductor device 211. As shown in FIG. 6, the semiconductor package 20 may not include the chip connection terminals 213 and/or the connection pads 116 in the passive element area PA.

In the semiconductor package 20 according to the present embodiment, since the connection area CA may be formed in the region in which the first semiconductor device 111 overlaps the second semiconductor device 211 in the vertical direction, the first semiconductor device 111 may be easily electrically connected to the second semiconductor device 211.

Furthermore, in the semiconductor package 20 according to the present embodiment, the passive element area PA may be formed in the region in which the first semiconductor device 111 does not overlap the second semiconductor device 211 in the vertical direction, the semiconductor package 20 may not include additional passive elements. Thus, the semiconductor package 20 may be thin and lightweight.

Figure 7:
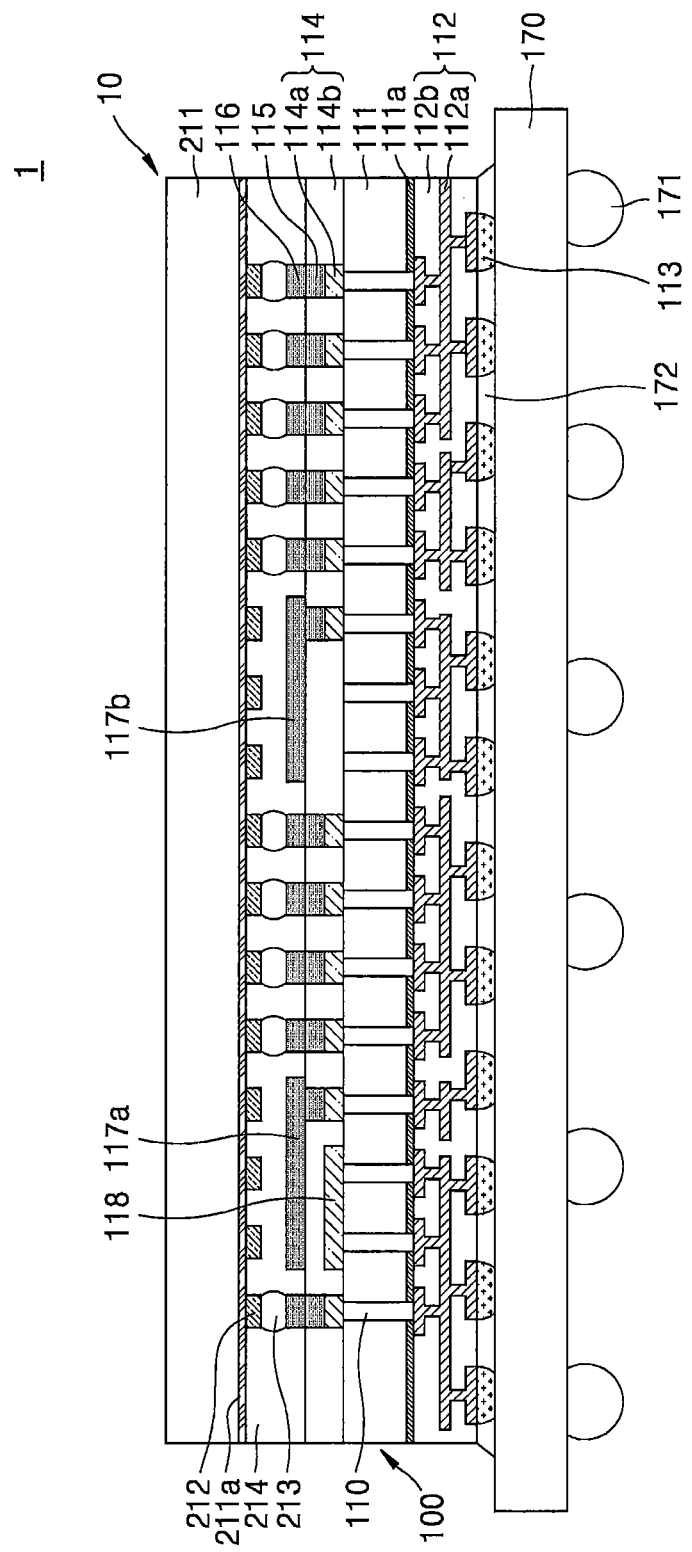

FIG. 7 is a cross-sectional view of a semiconductor package 1 according to an embodiment of the inventive concepts. The semiconductor package 1 of FIG. 7 may be a semiconductor package in which the semiconductor package 10 described with reference to FIG. 5 is mounted on a package substrate 170. Referring to FIG. 7, the semiconductor package 1 may further include a package substrate 170, external connection terminals 171, and a first molding compound 172.

In an embodiment, a first semiconductor device 111 and a second semiconductor device 211 may be stacked on the package substrate 170. Also, the first semiconductor device 111 and the second semiconductor device 211 may be electrically connected to the package substrate 170. For example, the first semiconductor device 111 may be electrically connected to the through silicon via 110, the lower redistribution pattern 112a, and the package connection terminals 113 and be electrically connected to the package substrate 170. The second semiconductor device 211 may be electrically connected to the chip pads 212, the chip connection terminals 213, the connection pads 116, the conductive vias 115, the upper redistribution pattern 114a, the through silicon via 110, the lower redistribution pattern 112a, and the package connection terminals 113 and be electrically connected to the package substrate 170.

In an embodiment, the package connection terminals 113 may be in contact with the package substrate 170. For example, the package connection terminals 113 may be in contact with upper package substrate pads (not shown) formed on the package substrate 170 and electrically connected to the upper package substrate pads. The package connection terminals 113 may be terminals configured to electrically connect the semiconductor package 1 to the external connection terminals 171.

In an embodiment, the first molding compound 172 may be interposed between a lower redistribution structure 112 and the package substrate 170. More specifically, the first molding compound 172 may be on, and in some embodiments surround, the package connection terminals 113 between the lower redistribution structure 112 and the package substrate 170. The first molding compound 172 may adhere the first semiconductor device 111 and the second semiconductor device 211 on the package substrate 170.

In an embodiment, the first molding compound 172 may include an insulating material. The first molding compound 172 may include at least one of an insulating polymer and an epoxy resin. For example, the first molding compound 172 may include an epoxy molding compound (EMC).

In a conventional device, passive elements used for an operation of a first semiconductor package and an operation of a second semiconductor device may be formed on the package substrate. In the semiconductor package 1 according to the present embodiment, the passive elements may be formed between the first semiconductor device 111 and the second semiconductor device 211 without forming the passive elements on the package substrate 170. More specifically, the semiconductor package 1 according to the present embodiment may include the passive element pattern 117 (e.g., patterns 117a and/or 117b) on an upper redistribution structure 114, and the passive element pattern 117 (e.g., patterns 117a and/or 117b) may implement the passive elements used for an operation of the first semiconductor device 111 and/or an operation of the second semiconductor device 211.

The semiconductor package 1 according to the present embodiment may not need to include additional passive elements on the package substrate 170. Thus, the semiconductor package 1 according to the present embodiment may be thin and lightweight.

Furthermore, since the semiconductor package 1 according to the present embodiment may include the passive element pattern 117 (e.g., patterns 117a and/or 117b) between the first semiconductor device 111 and the second semiconductor device 211, an electrical path from the first semiconductor device 111 to the passive element pattern 117 (e.g., patterns 117a and/or 117b) and an electrical path from the second semiconductor device 211 to the passive element pattern 117 (e.g., patterns 117a and/or 117b) may be shortened.

Figure 8:
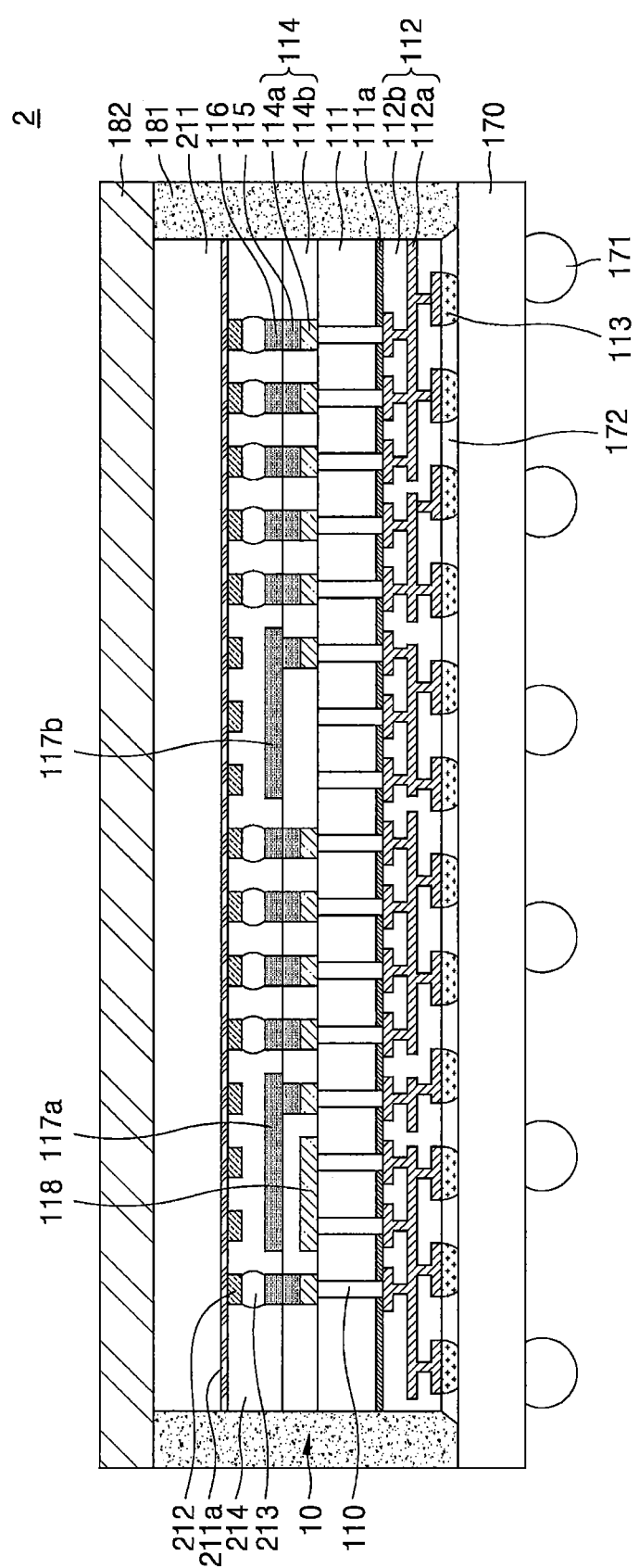

FIG. 8 is a cross-sectional view of a semiconductor package 2 according to an embodiment of the inventive concepts. The semiconductor package 2 of FIG. 8 may be a semiconductor package in which the semiconductor package 10 described with reference to FIG. 5 is mounted on a package substrate 170. Referring to FIG. 8, the semiconductor package 2 may further include a second molding compound 181 and a heat sink 182.

In an embodiment, the second molding compound 181 may be on the package substrate 170. More specifically, the second molding compound 181 may be on, and in some embodiments surround, a first semiconductor device 111 and a second semiconductor device 211 on the package substrate 170. The second molding compound 181 may assist in adhering the first semiconductor device 111 and the second semiconductor device 211 on the package substrate 170.

A side surface of the second molding compound 181 may be on and/or self-aligned with a side surface of the semiconductor package 2. A top surface of the second molding compound 181 may be at the same level as a top surface of the second semiconductor device 211. However, the inventive concepts are not limited thereto. In some embodiments, the second molding compound 181 may be on and/or cover the top surface of the second semiconductor device 211, and the top surface of the second molding compound 181 may be at a higher level than the top surface of the second semiconductor device 211.

In an embodiment, the heat sink 182 may be mounted on the second molding compound 181. The heat sink 182 may be configured to emit heat generated by the first semiconductor device 111 and/or the second semiconductor device 211 to the outside.

In an embodiment, the heat sink 182 may include a highly thermal conductive metal material. For example, the heat sink 182 may include at least one metal material of aluminum (Al), nickel (Ni), copper (Cu), magnesium (Mg), and/or silver (Ag). Also, the heat sink 182 may be adhered onto the second molding compound 181 by an adhesive film (not shown). The adhesive film may be a self-adhesive film. For example, the adhesive film may be a double-sided adhesive film.

Figure 9:
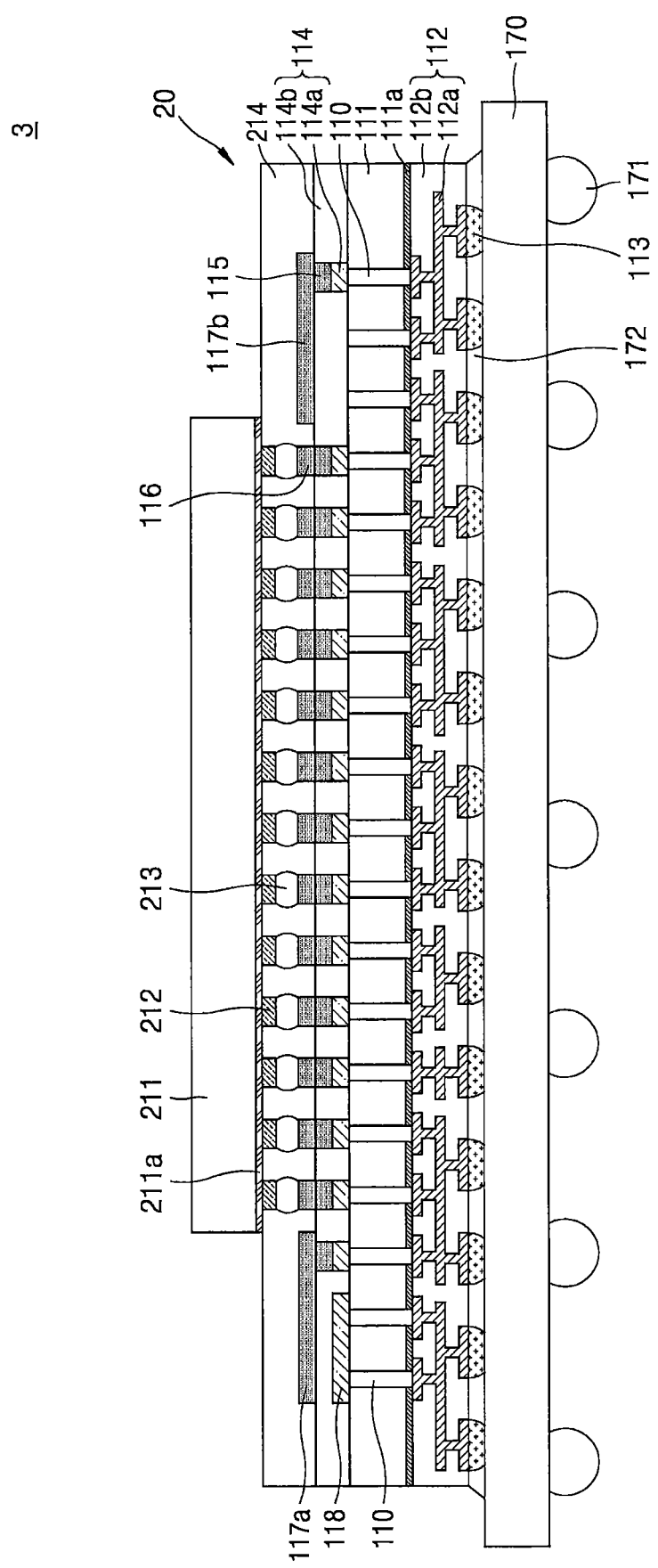

FIG. 9 a cross-sectional view of a semiconductor package 3 according to an embodiment of the inventive concepts. The semiconductor package 3 of FIG. 9 may be a semiconductor package in which the semiconductor package 20 described with reference to FIG. 6 is mounted on a package substrate 170. The semiconductor package 3 according to the present embodiment may be understood with reference to the semiconductor package 1 described with reference to FIG. 7 and thus, a detailed description thereof will be omitted.

Figure 10:
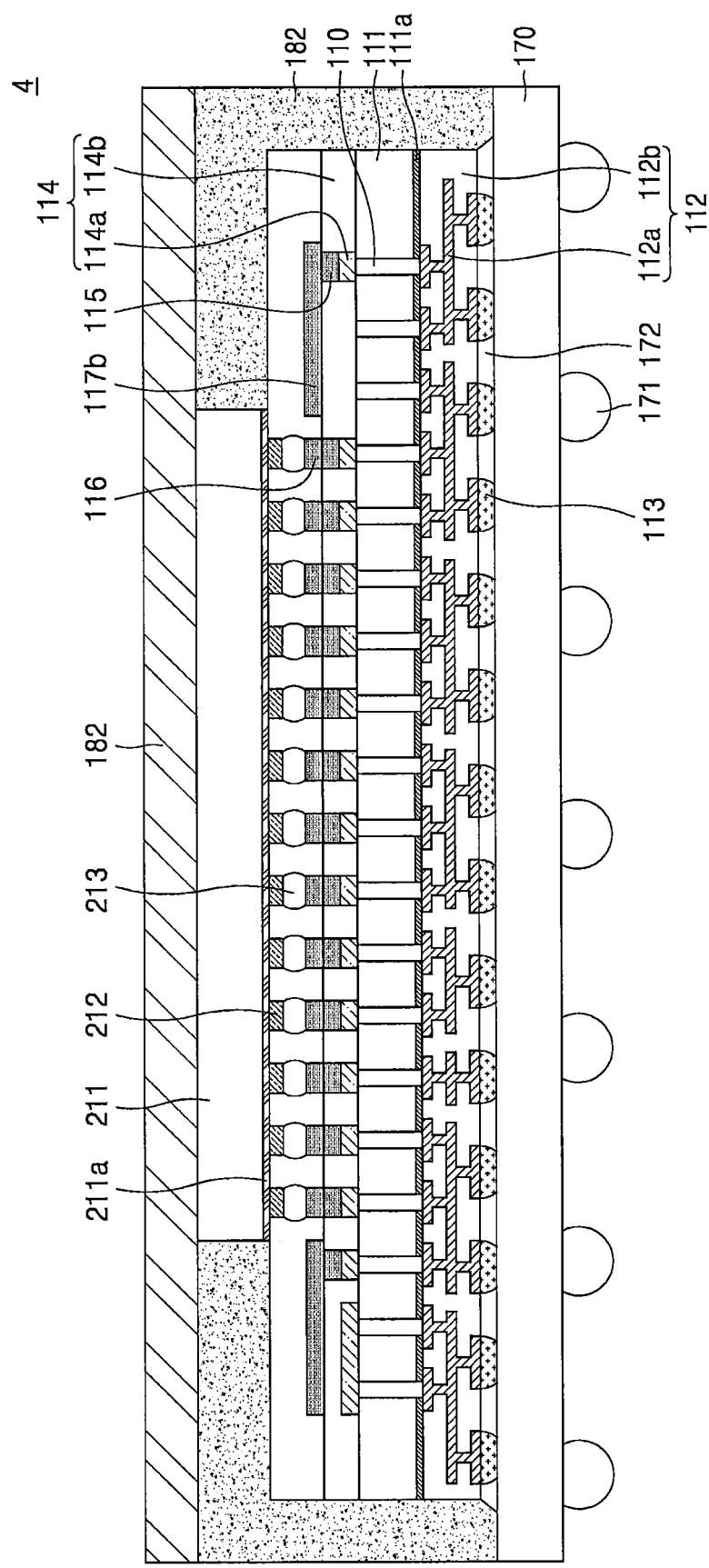

FIG. 10 is a cross-sectional view of a semiconductor package 4 according to an embodiment of the inventive concepts. The semiconductor package 4 of FIG. 10 may be a semiconductor package in which the semiconductor package 20 described with reference to FIG. 6 is mounted on a package substrate 170. The semiconductor package 4 may further include a second molding compound 181 and a heat sink 182. The semiconductor package 4 according to the present embodiment may be understood with reference to the semiconductor package 3 described with reference to FIG. 9 and thus, a detailed description thereof will be omitted.

FIGS. 11 to 21 are cross-sectional views illustrating operations of a method of manufacturing a semiconductor package according to an embodiment of the inventive concepts. More specifically, FIGS. 11 to 21 are cross-sectional views illustrating operations of a method of manufacturing the semiconductor package 2 described with reference to FIG. 8.

Figure 11:
FIGS. 11 to 21 are cross-sectional views illustrating operations of a method of manufacturing a semiconductor package according to an embodiment of the inventive concepts.

FIG. 11 is a cross-sectional view illustrating an operation of forming a through silicon via 110 in a first semiconductor device 111. In an embodiment, the formation of the through silicon via 110 in the first semiconductor device 111 may include forming a through hole in the first semiconductor device 111 and/or the first semiconductor element layer 111a. The through hole may be formed using an anisotropic etching process or a laser drilling process.

In an embodiment, the formation of the through silicon via 110 in the first semiconductor device 111 may include filling the through hole with a conductive material. The conductive material may include a metal material, for example, at least one metal of copper (Cu), aluminum (Al), nickel (Ni), tungsten (W), platinum (Pt), and/or gold (Au). The conductive material in, and in some embodiments, filling the through hole may form the through silicon via 110.

Figure 12:
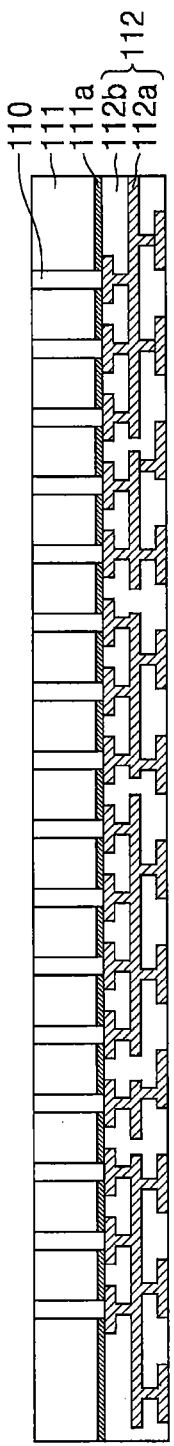

FIG. 12 is a cross-sectional view illustrating an operation of forming a lower redistribution structure 112 on the first semiconductor device 111. In an embodiment, the formation of the lower redistribution structure 112 may include forming a lower redistribution pattern 112a and a lower redistribution insulating layer 112b on the first semiconductor device 111. The lower redistribution pattern 112a and the lower redistribution insulating layer 112b may be formed using a photolithography process and an electroplating process.

Figure 13:
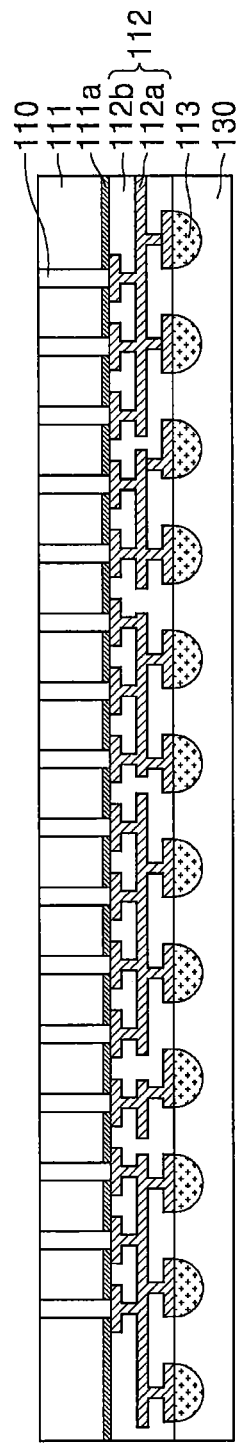

FIG. 13 is a cross-sectional view illustrating an operation of forming package connection terminals 113. In an embodiment, the formation of the package connection terminals 113 may include electrically connecting the package connection terminals 113 to the lower redistribution pattern 112a. The package connection terminals 113 may include a metal material containing at least one of tin, silver, copper, and/or aluminum.

As shown in FIG. 13, after the formation of the package connection terminals 113, a protective substrate 130 may be formed under the lower redistribution structure 112. The protective substrate 130 may protect the package connection terminals 113 from external impact during operations for manufacturing the semiconductor package.

Figure 14:
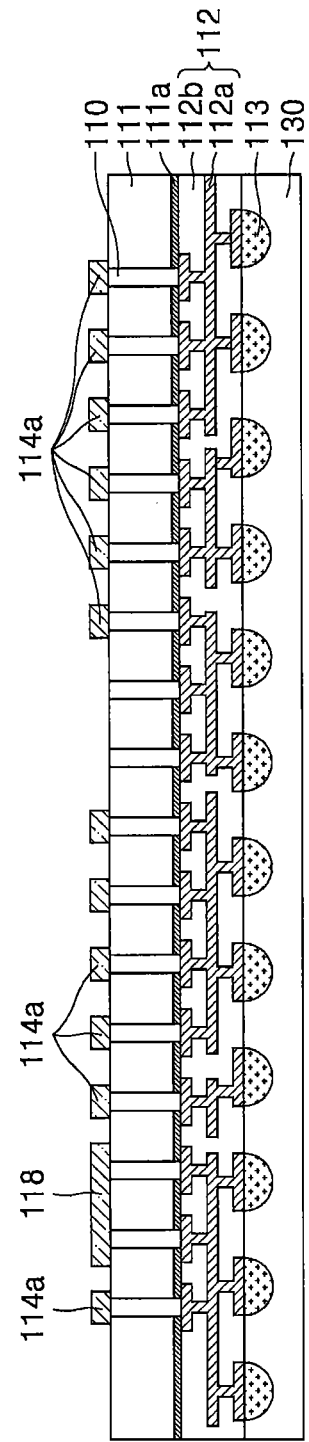

FIG. 14 is a cross-sectional view illustrating an operation of forming an upper redistribution pattern 114a and a second plate-type conductive pattern 118. The upper redistribution pattern 114a and the second plate-type conductive pattern 118 may be formed using a photolithography process and an electroplating process. The second plate-type conductive pattern 118 may implement a passive element including a function of a capacitor along with the first plate-type conductive pattern 117a.

In an embodiment, the formation of the upper redistribution pattern 114a and the second plate-type conductive pattern 118 may include simultaneously forming the upper redistribution pattern 114a and the second plate-type conductive pattern 118.

A method of manufacturing a conventional semiconductor package may include forming passive elements on a package substrate. However, in the method of manufacturing the semiconductor package according to the present embodiment, the upper redistribution pattern 114a and the second plate-type conductive pattern 118 may be simultaneously formed. As a result, the operations for manufacturing the semiconductor package according to the present embodiment may be rapidly performed, and the manufacturing costs of the semiconductor package may be reduced.

Furthermore, the method of manufacturing the semiconductor package according to the present embodiment may include forming the second plate-type conductive pattern 118 on the first semiconductor device 111. Therefore, a semiconductor package manufactured using the method of manufacturing the semiconductor package according to the present embodiment may be thin and lightweight.

In an embodiment, the formation of the upper redistribution pattern 114a and the second plate-type conductive pattern 118 may include forming the upper redistribution pattern 114a and the second plate-type conductive pattern 118 using the same material. For example, the upper redistribution pattern 114a and the second plate-type conductive pattern 118 may include at least one material of copper (Cu), aluminum (Al), nickel (Ni), tungsten (W), platinum (Pt), and/or gold (Au).

In an embodiment, the formation of the upper redistribution pattern 114a and the second plate-type conductive pattern 118 may include forming the upper redistribution pattern 114a and the second plate-type conductive pattern 118 to substantially the same thickness. For example, a top surface of the upper redistribution pattern 114a may be at substantially the same level as a top surface of the second plate-type conductive pattern 118.

Figure 15:
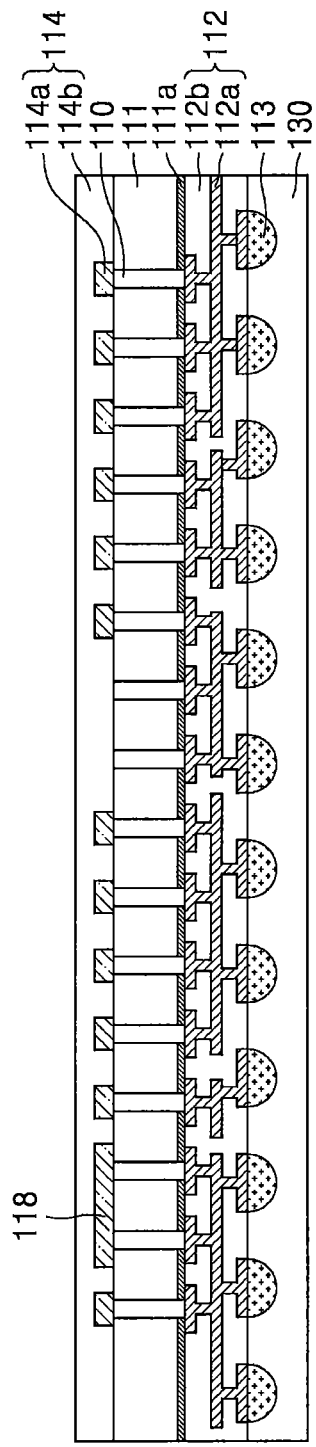

FIG. 15 is a cross-sectional view illustrating an operation of forming the upper redistribution insulating layer 114b. In an embodiment, the forming the upper redistribution insulating layer 114b may include coating the first semiconductor device 111 with an insulating material to cover the top surfaces and side surfaces of the upper redistribution pattern 114a and the second plate-type conductive pattern 118.

In addition, the coating of the first semiconductor device 111 with the upper redistribution insulating layer 114b may include coating the first semiconductor device 111 with an insulating material including at least one material of an epoxy resin, PBO, BCB, polyimide, and/or a polyimide derivative.

Figure 16:
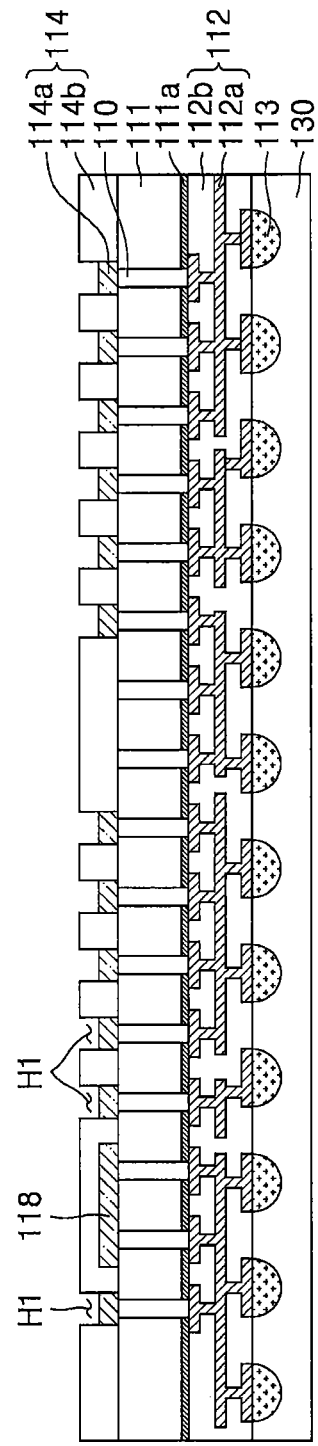

FIG. 16 is a cross-sectional view illustrating an operation of selectively etching the upper redistribution insulating layer 114b. In an embodiment, the selective etching of the upper redistribution insulating layer 114b may include forming via holes H1 in the upper redistribution insulating layer 114b. The selective etching of the upper redistribution insulating layer 114b may expose the top surface of the upper redistribution pattern 114a to the outside.

Referring to FIG. 16, the via holes H1 may be formed on the top surface of the upper redistribution pattern 114a. In some embodiments, the via holes H1 may not be formed on the second plate-type conductive pattern 118. In other words, the top surface of the second plate-type conductive pattern 118 may be covered by the upper redistribution insulating layer 114b.

Figure 17:
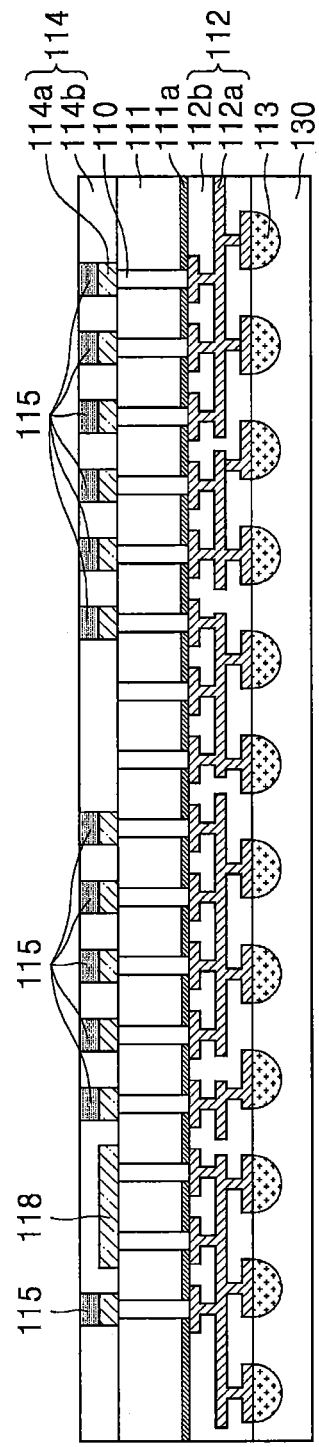

FIG. 17 is a cross-sectional view illustrating an operation of forming conductive vias 115. In an embodiment, the formation of the conductive vias 115 may include filling the via holes H1 formed in the upper redistribution insulating layer 114b with a conductive material. The conductive material may include a metal material, for example, at least one metal of copper (Cu), aluminum (Al), nickel (Ni), tungsten (W), platinum (Pt), and/or gold (Au). The conductive material in the via holes H1 may form the conductive vias 115.

Figure 18:
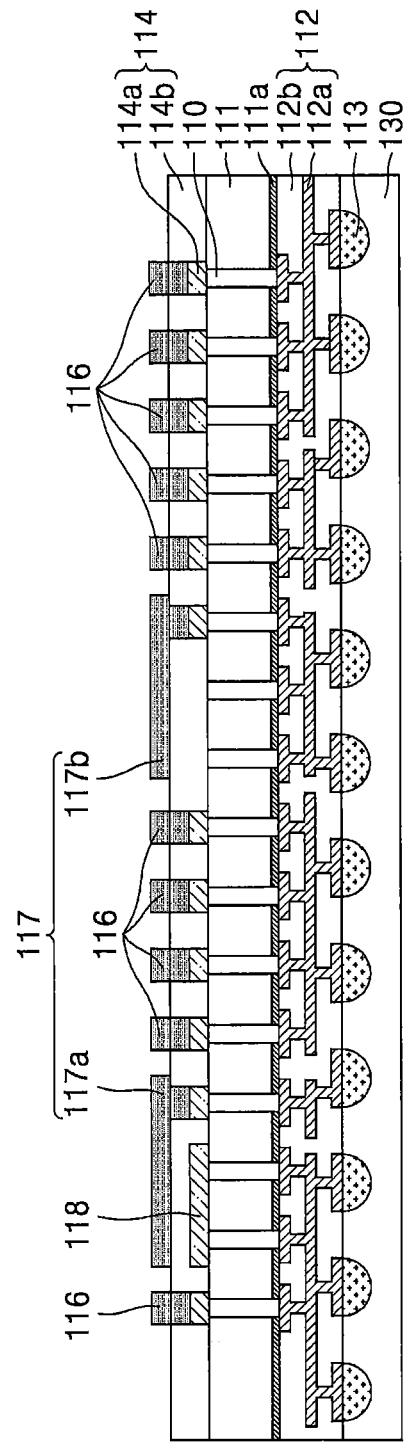

FIG. 18 is a cross-sectional view illustrating an operation of forming connection pads 116 and a passive element pattern 117. The connection pads 116a and the passive element pattern 117 may be formed using a photolithography process and an electroplating process.

In an embodiment, the formation of the passive element pattern 117 may include forming a first plate-type conductive pattern 117a on an upper redistribution structure 114. The first plate-type conductive pattern 117a may implement a passive element including functions of a capacitor and/or a resistor along with the second plate-type conductive pattern 118 described above. An upper redistribution insulating layer 114b interposed between the first plate-type conductive pattern 117a and the second plate-type conductive pattern 118 may have a thickness of about 2 μm to about 5 μm. The first plate-type conductive pattern 117a may be substantially the same as described with reference to FIGS. 1 to 3 and thus, a detailed description thereof will be omitted.

In an embodiment, the formation of the passive element pattern 117 may include a spiral conductive pattern 117b on the upper redistribution structure 114. The spiral conductive pattern 117b may implement a passive element including functions of an inductor and/or a resistor.

In an embodiment, the spiral conductive pattern 117b may be formed in a spiral shape. Also, when the spiral conductive pattern 117b is viewed from above, the spiral conductive pattern 117b may be formed to a width (refer to d2 in FIG. 4) of about 2 μm to about 15 μm. The spiral conductive pattern 117b according to the present embodiment may be substantially the same as described with reference to FIGS. 1 to 4 and thus, a detailed description thereof will be omitted.

In an embodiment, the formation of the connection pads 116 and the passive element pattern 117 may include simultaneously forming the connection pads 116 and the passive element pattern 117. As a result, the operations for manufacturing the semiconductor package according to the present embodiment may be rapidly performed, and the manufacturing costs of the semiconductor package may be reduced.

In an embodiment, the formation of the connection pads 116 and the passive element pattern 117 may include forming the connection pads 116 and the passive element pattern 117 using the same material. For example, the connection pads 116 and the passive element pattern 117 may include at least one material of copper (Cu), aluminum (Al), nickel (Ni), tungsten (W), platinum (Pt), and/or gold (Au).

In an embodiment, the formation of the connection pads 116 and the passive element pattern 117 may include forming the connection pads 116 and the passive element pattern 117 to substantially the same thickness. For example, the connection pads 116 and the passive element pattern 117 may be formed to a thickness of about 2 μm to about 5 μm. Also, the connection pads 116 and the passive element pattern 117 may be formed such that top surfaces of the connection pads 116 and a top surface of the passive element pattern 117 are at substantially the same level.

Figure 19:
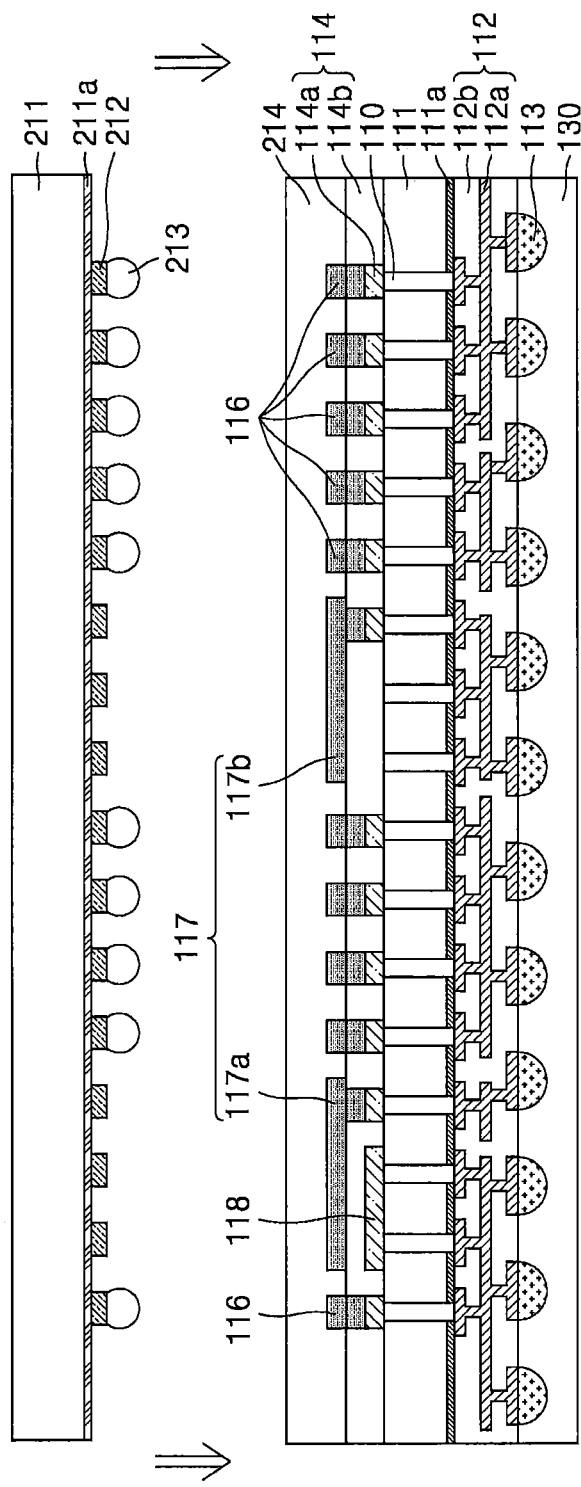

FIG. 19 is a cross-sectional view illustrating an operation of mounting a second semiconductor device 211 on the first semiconductor device 111. The mounting of the second semiconductor device 211 on the first semiconductor device 111 may include adhering chip connection terminals 213 onto chip pads 212 of the second semiconductor device 211, adhering an adhesive layer 214 onto the upper redistribution structure 114, and electrically connecting the chip connection terminals 213 to the connection pads 116.

In an embodiment, after the electrical connection of the chip connection terminals 213 to the connection pads 116, an operation of detaching the protective substrate 130 from the lower redistribution structure 112 may be performed.

Due to the operations for manufacturing the semiconductor package, which are described with reference to FIGS. 11 to 19, a first semiconductor package 100 may be formed. The first semiconductor package 100 may be the semiconductor package 100 described with reference to FIG. 1.

Figure 20:
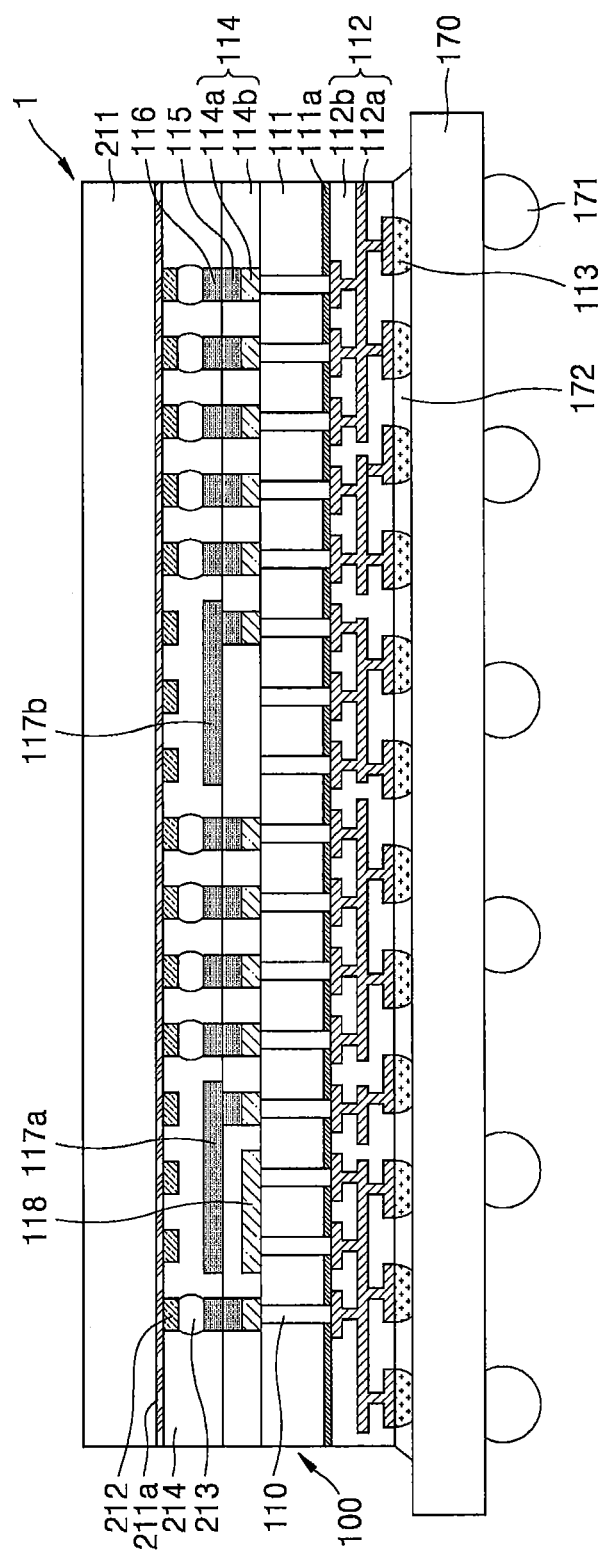

FIG. 20 is a cross-sectional view illustrating an operation of mounting the first semiconductor package 100 formed due to the above-described manufacturing operations, on the package substrate 170. The mounting of the first semiconductor package 100 on the package substrate 170 may include electrically connecting the package connection terminals 113 to the package substrate 170 and forming a first molding compound 172 between the lower redistribution structure 112 and the package substrate 170. In an embodiment, the package connection terminals 113 may be formed to be in contact with upper package substrate pads (not shown) formed on the package substrate 170. Also, the first molding compound 172 may be formed on the package substrate 170 to surround the package connection terminals 113.

Due to the manufacturing operation of FIG. 20, a second semiconductor package 1 may be formed. The second semiconductor package 1 may be the semiconductor package described with reference to FIG. 7.

Figure 21:
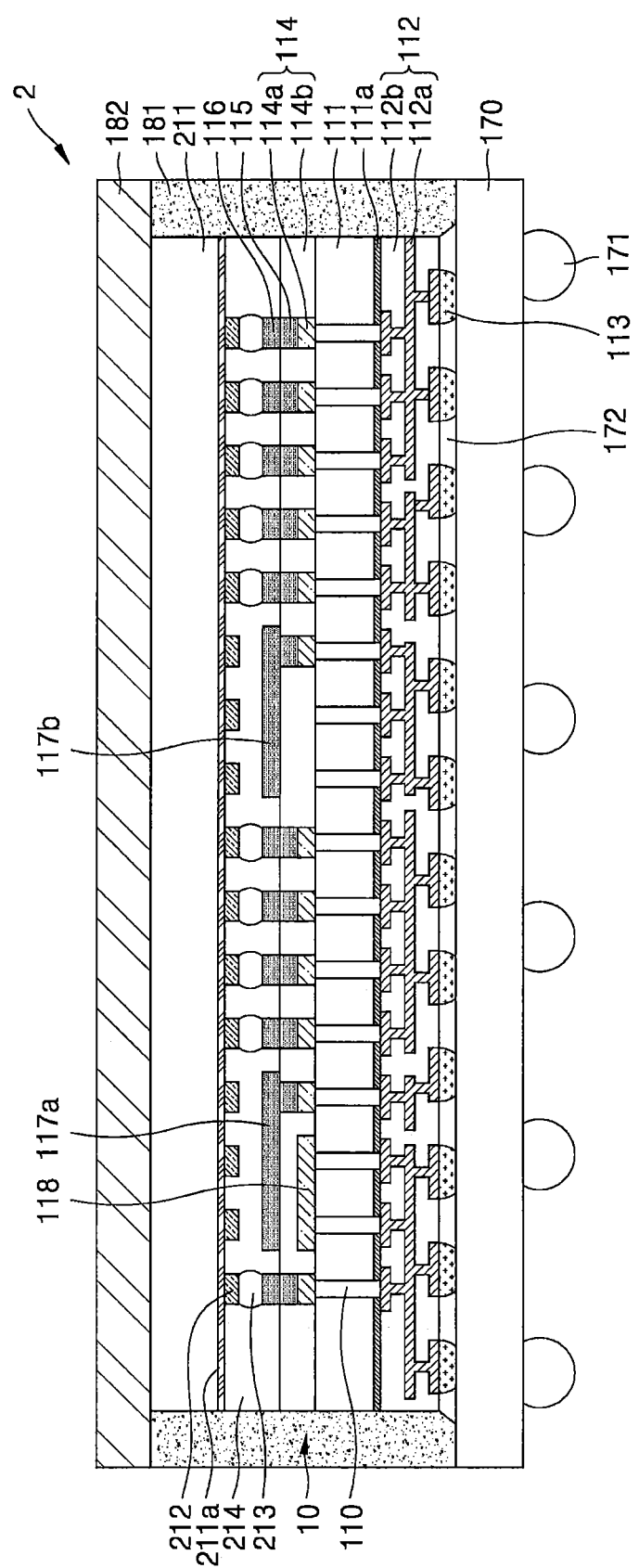

FIG. 21 is a cross-sectional view illustrating an operation of forming a second molding compound 181 and a heat sink 182. In an embodiment, the formation of the second molding compound 181 may include forming the second molding compound 181 on the package substrate 170 to be on and/or surround a side surface of the second semiconductor package 1. In some embodiments, the formation of the second molding compound 181 may include forming the second molding compound 181 to be on and/or cover a top surface and the side surface of the second semiconductor package 1 and removing an upper portion of the second molding compound 181. The removal of the upper portion of the second molding compound 181 may include removing the upper portion of the second molding compound 181 such that a top surface of the second molding compound 181 is at substantially the same level as a top surface of the second semiconductor device 211.

Furthermore, the formation of the heat sink 182 may include adhering the heat sink 182 including a highly thermal conductive metal material to the top surface of the second molding compound 181 and the top surface of the second semiconductor device 211 using an adhesive film (not shown).

Due to the manufacturing operation of FIG. 21, a third semiconductor package 2 may be formed. The third semiconductor package 2 may be the semiconductor package 2 described with reference to FIG. 8.

The method of manufacturing the semiconductor package according to the present embodiment may include forming a passive element pattern 117 on the first semiconductor device 111. Accordingly, the semiconductor package 2 according to the present embodiment may not include additional passive elements on the package substrate 170. Thus, the semiconductor package 2 may be thin and lightweight.

In addition, since the method of manufacturing the semiconductor package according to the present embodiment may include forming the passive element pattern 117 on the first semiconductor device 111, an operation of forming additional passive elements on the package substrate 170 may not be performed. As a result, the operations for manufacturing the semiconductor package according to the present embodiment may be rapidly performed, and the manufacturing costs of the semiconductor package may be reduced.

While the inventive concepts have been particularly shown and described with reference to embodiments thereof, it will be understood that various changes in form and details may be made therein without departing from the scope of the following claims.

What is claimed is:

1. A semiconductor package comprising:
a package substrate;
an external connection terminal electrically connected to the package substrate;
a first semiconductor device on the package substrate, the first semiconductor device comprising a through silicon via;
a lower redistribution structure between the first semiconductor device and the package substrate, the lower redistribution structure comprising a lower redistribution insulating layer and a lower redistribution pattern electrically connected to the through silicon via;
a package connection terminal between the lower redistribution structure and the package substrate, the package connection terminal being configured to electrically connect the lower redistribution pattern to the package substrate;
an upper redistribution structure on the first semiconductor device, the upper redistribution structure comprising an upper redistribution insulating layer and an upper redistribution pattern electrically connected to the through silicon via;
a conductive via in contact with the upper redistribution pattern, the conductive via being on the upper redistribution insulating layer;
a connection pad on the conductive via;
a passive element pattern on the upper redistribution structure;
a chip connection terminal on the connection pad;
an adhesive layer on the chip connection terminal and on the upper redistribution structure; and
a chip pad electrically connected to the chip connection terminal,
wherein the connection pad is between the conductive via and the chip connection terminal,
wherein the passive element pattern is between the upper redistribution insulating layer and the adhesive layer and is electrically connected to the conductive via, and
wherein at least a portion of the passive element pattern is at a same level as the connection pad.

2. The semiconductor package of claim 1, wherein the passive element pattern comprises a same material as the connection pad, and
wherein a top surface of the passive element pattern is at the same level as a top surface of the connection pad.

3. The semiconductor package of claim 1, wherein the upper redistribution insulating layer comprises at least one of an epoxy resin, polybenzobisoxazole (PBO), benzocyclobutene (BCB), polyimide, and a polyimide derivative.

4. The semiconductor package of claim 1, wherein the passive element pattern comprises a first plate-type conductive pattern,
wherein the semiconductor package further comprises a second plate-type conductive pattern electrically connected to the through silicon via in the upper redistribution insulating layer, at least a portion of the second plate-type conductive pattern overlapping the first plate-type conductive pattern in a vertical direction, and
wherein a portion of the upper redistribution insulating layer is between the first plate-type conductive pattern and the second plate-type conductive pattern.

5. The semiconductor package of claim 4, wherein the second plate-type conductive pattern comprises a same material as the upper redistribution pattern, and
wherein a top surface of the second plate-type conductive pattern is at a same level as a top surface of the upper redistribution pattern.

6. The semiconductor package of claim 4, wherein the portion of the upper redistribution insulating layer that is between the first plate-type conductive pattern and the second plate-type conductive pattern has a thickness of about 2 μm to about 5 μm.

7. The semiconductor package of claim 1, wherein the passive element pattern comprises a spiral conductive pattern, and
wherein the spiral conductive pattern is between the upper redistribution structure and the adhesive layer.

8. The semiconductor package of claim 7, wherein the spiral conductive pattern has a width of about 2 μm to about 15 μm and has a thickness of about 2 μm to about 5 μm.

9. The semiconductor package of claim 7, wherein the spiral conductive pattern has a circular shape or a polygonal shape.

10. The semiconductor package of claim 1, wherein the conductive via is a first conductive via,
wherein the semiconductor package comprises a second conductive via within the upper redistribution insulating layer, and
wherein a bottom surface of the passive element pattern is in contact with a top surface of the second conductive via.

11. A semiconductor package comprising:
a first semiconductor device comprising a through silicon via;
a lower redistribution structure on the first semiconductor device, the lower redistribution structure comprising a lower redistribution insulating layer and a lower redistribution pattern electrically connected to the through silicon via;
a package connection terminal on the lower redistribution structure, the package connection terminal being electrically connected to the lower redistribution pattern;
an upper redistribution structure on the first semiconductor device, the upper redistribution structure comprising an upper redistribution insulating layer and an upper redistribution pattern electrically connected to the through silicon via;
a conductive via in contact with the upper redistribution pattern, the conductive via being on the upper redistribution insulating layer;
a connection pad on the conductive via;
a passive element pattern on the upper redistribution structure;
a chip connection terminal on the connection pad;
an adhesive layer on the chip connection terminal;
a chip pad electrically connected to the chip connection terminal; and
a second semiconductor device on the first semiconductor device,
wherein the connection pad is between the conductive via and the chip connection terminal,
wherein the passive element pattern is between the upper redistribution insulating layer and the adhesive layer and is electrically connected to the conductive via,
wherein a width of the first semiconductor device is greater than a width of the second semiconductor device, and
wherein the passive element pattern is on a portion of the upper redistribution structure in which the first semiconductor device does not overlap the second semiconductor device in a vertical direction.

12. The semiconductor package of claim 11, wherein the connection pad comprises a same material as the passive element pattern, and the connection pad has a same thickness as the passive element pattern.

13. The semiconductor package of claim 11, wherein the passive element pattern comprises a first plate-type conductive pattern between the upper redistribution insulating layer and the adhesive layer, and
wherein the semiconductor package further comprises a second plate-type conductive pattern electrically connected to the through silicon via in the upper redistribution insulating layer, at least a portion of the second plate-type conductive pattern overlapping the first plate-type conductive pattern in a vertical direction,
wherein a portion of the upper redistribution insulating layer that is interposed between the first plate-type conductive pattern and the second plate-type conductive pattern has a thickness of about 2 μm to about 5 μm.

14. The semiconductor package of claim 11, wherein the passive element pattern comprises a spiral conductive pattern between the upper redistribution insulating layer and the adhesive layer, and
wherein the spiral conductive pattern has a width of about 2 μm to about 15 μm and a thickness of about 2 μm to about 5 μm.

15. A semiconductor package comprising:
a semiconductor device comprising a through silicon via;
a lower redistribution structure on the semiconductor device, the lower redistribution structure comprising a lower redistribution insulating layer and a lower redistribution pattern electrically connected to the through silicon via;
a package connection terminal on the lower redistribution structure, the package connection terminal being electrically connected to the lower redistribution pattern;
an upper redistribution structure on the semiconductor device, the upper redistribution structure comprising an upper redistribution insulating layer and an upper redistribution pattern electrically connected to the through silicon via;
a conductive via in contact with the upper redistribution pattern, the conductive via being on the upper redistribution insulating layer;
a connection pad on the conductive via; and
a passive element pattern on the upper redistribution structure, the passive element pattern electrically connected to the conductive via,
wherein a first distance between a bottom surface of the passive element pattern and the upper redistribution structure is smaller than a second distance between a top surface of the connection pad and the upper redistribution structure.

16. The semiconductor package of claim 15, wherein the connection pad comprises a same material as the passive element pattern, and the connection pad has a same thickness as the passive element pattern.

17. The semiconductor package of claim 15, wherein the passive element pattern comprises a plate-type conductive pattern and a spiral conductive pattern, and the passive element pattern is on the upper redistribution insulating layer.

18. The semiconductor package of claim 15, wherein the passive element pattern comprises a first plate-type conductive pattern, wherein the semiconductor package further comprises a second plate-type conductive pattern electrically connected to the through silicon via in the upper redistribution insulating layer, at least a portion of the second plate-type conductive pattern overlapping the first plate-type conductive pattern in a vertical direction, and wherein a portion of the upper redistribution insulating layer that is between the first plate-type conductive pattern and the second plate-type conductive pattern has a thickness of about 2 µm to about 5 µm.

19. The semiconductor package of claim 18, wherein the second plate-type conductive pattern comprises a same material as the upper redistribution pattern, and the second plate-type conductive pattern has a same thickness as the upper redistribution pattern.

20. The semiconductor package of claim 15, wherein the passive element pattern comprises a spiral conductive pattern, and wherein the spiral conductive pattern has a width of about 2 µm to about 15 µm and has a thickness of about 2 µm to about 5 µm.

\* \* \* \* \*